United States Patent

Ternullo, Jr.

[11] Patent Number: 5,954,830
[45] Date of Patent: Sep. 21, 1999

[54] METHOD AND APPARATUS FOR ACHIEVING HIGHER PERFORMANCE DATA COMPRESSION IN ABIST TESTING BY REDUCING THE NUMBER OF DATA OUTPUTS

[75] Inventor: Luigi Ternullo, Jr., San Jose, Calif.

[73] Assignee: International Business Machines Corporation, Armonk, N.Y.

[21] Appl. No.: 08/831,257

[22] Filed: Apr. 8, 1997

[51] Int. Cl.$^6$ ........................................ G06F 11/00
[52] U.S. Cl. ................................................ 714/718
[58] Field of Search ............................. 371/21.1, 21.2, 371/21.4, 21.6, 22.1, 22.4, 22.5, 22.6, 25.1, 27.1

[56] References Cited

U.S. PATENT DOCUMENTS

| | | |
|---|---|---|
| 4,498,172 | 2/1985 | Bhavsar . |
| 4,768,196 | 8/1988 | Jou et al. . |
| 4,903,266 | 2/1990 | Hack . |
| 5,260,906 | 11/1993 | Mizukami . |
| 5,325,367 | 6/1994 | Dekker et al. . |
| 5,388,104 | 2/1995 | Shirotori et al. . |
| 5,416,741 | 5/1995 | Ohsawa . |

FOREIGN PATENT DOCUMENTS 57-6491  1/1982  Japan .

OTHER PUBLICATIONS

A.D. Savkar; "N–Way Testpoint for Complex LSI Design"; IBM Technical Disclosure Bulletin, vol. 14, No. 10, Mar. 1972, pp. 2937–2938.

P.S. Balasubramanian et al.; "Increasing Chip Density by Space Sharing of Programmed Logic Arrays"; IBM Technical Disclosure Bulletin, vol. 20, No. 10, Mar. 1978, pp. 4016–4018.

*Primary Examiner*—Vincent P. Canney
*Attorney, Agent, or Firm*—Whitham, Curtis & Whitham; Howard J. Walter, Jr., Esq.

[57] ABSTRACT

A method and apparatus for testing circuitry, such as a memory or a logic circuit, having a plurality of outputs, includes a built-in self-testing (BIST) test state machine for generating a plurality of address outputs, a plurality of multiplexers controlled by the address outputs of the test state machine, and a testing device for testing the plurality of outputs of the circuitry based on the address outputs of the test state machine. The plurality of outputs of the circuitry are input to the plurality of multiplexers and a number of outputs tested simultaneously is less than a total number of outputs of the circuitry.

20 Claims, 3 Drawing Sheets

METHOD AND APPARATUS FOR ACHIEVING HIGHER PERFORMANCE DATA COMPRESSION IN ABIST TESTING BY REDUCING THE NUMBER OF DATA OUTPUTS

BACKGROUND OF THE INVENTION

The present invention generally relates to a method and apparatus for testing large-count memory portions by compressing the outputs with a multiplexer and using a built-in self tester (BIST) counter to address the multiplexer outputs to be observed. With the invention, the number of output latches is reduced by adding a test multiplexer that further multiplexes down the output data by a predetermined factor before latching the data.

DESCRIPTION OF THE RELATED ART

Integrated circuit designs require testing following their development, to detect faults.

One method of testing referred to as built-in self testing (BIST) has been employed with components including programmable logic arrays (PLAs). Under the BIST approach, the logic required to generate tests for a circuit, and the logic required for analysis of the circuits relative to these tests, are implemented in hardware residing within the same system as the circuit under test. Thus, the circuit is capable of testing itself and reporting to its environment whether it is a working circuit or not. The components tested may be a card, wafer, or an integrated circuit chip including a memory.

In testing components, on-chip testing is preferred and has been prevalent in recent years, and it is desirable to test all storage points in both the logical "0" and "1" states.

Automated built-in self testing (ABIST) of memories requires an interface to the memory through input and output boundary latches. The latches serve as logic circuit storage elements. Each input and output has a latch through which the ABIST test data can be supplied and captured for compression, respectively. Data sent through the input latches is "muxed" (e.g., multiplexed) with the functional data and output to the memory input. The mux selection between the test data and the functional data is controlled by the tester machine.

The latch inputs are "dotted off" of the memory outputs to observe the data. For purposes of this application, "dotted off" means being provided to testing structure in parallel to other logic circuitry of the chip (e.g., wired in parallel). The only performance loss to the output signal is attributed to the input capacitance of the latch (e..g, no more than a 20 to 50 ps additional delay). Each of these latches feeds directly to the compression circuits. The data is compared against the expected data and compressed to generate a single fail signature.

Thereafter, this single fail signature is output off-chip for analysis and evaluation, if this is the only memory being tested by the ABIST. Alternatively, if multiple memories are being tested, the single fail signature is sent to the next stage of compression prior to being sent off-chip to generate a single chip fail signal.

Circuit testing by signature analysis is known, in which known test data patterns are used to stimulate logic or memory circuits. Data output from the stimulated circuits are fed into a logic circuit which compresses the data into a data signature. Then, the data signature is compared with a known data signature which would result if the logic or memory circuits function properly.

Signature analysis is useful as a testing method because of the compression of the outputted test data. That is, the storing of test data for each output response is not required, thereby reducing tester complexity and test data volume. Although this feature also prevents easily determining the precise location of circuit failure, such a drawback is irrelevant since the high circuit density and low cost of the integrated circuit chips has made it impractical to repair a detected failure. Instead, typically a failed chip is simply discarded and another is substituted in its place.

FIG. 1 illustrates a conventional structure 10 for testing a memory 13 (e.g., a Translation Look-aside Buffer (TLB)) with a conventional testing structure, and shows one latch (e.g., 100 input latches) for every input and output, and a compression of all 200 outputs at the same time.

Specifically, in FIG. 1, input latches 11 each are arranged to provide an output (e.g., 100 1-bit outputs) to an input multiplexer 12 for input multiplexing ("muxing"). Thus, each latch provides a single 1-bit output to a multiplexer. The multiplexer 12 serves to "steer" the data to one of two inputs of the TLB 13. In this operation, the output from the latches 11 is multiplexed with an address signal (e.g., a 1-bit address signal). The address signal is provided from the state machine during a testing mode, and by an on-chip system processor during a normal mode. However, it is noted that if a dynamic multiplexer was employed that required true and complement data, each latch would provide two signals for each of the 100 inputs (e.g., 200 in total). That is, a true value and a complement value would be provided for each of the 100 inputs.

Multiplexer 12 in turn provides a plurality of outputs to the Translation Look-Aside Buffer (TLB) 13. The TLB serves as a memory being tested and is for storing data to be accessed.

TLB 13 provides outputs to an output multiplexer 14 which performs output multiplexing. The output of the multiplexer 14 is a 200-bit output (e.g., 200 1-bit outputs; however, once again if a dynamic output were used there would be 400 physical outputs) provided to test observation latches 15 (e.g., 200 latches), as well as to logic and other components of the memory system for subsequent processing as is known by one of ordinary skill in the art. It is noted that the related art system may not have to employ the output multiplexer 14 if the memory is 200 bits wide. In such a case, further multiplexing (e.g., for the memory output) would not be necessary, and the memory output would be provided simply to the observation latches or the downstream logic circuitry.

Observation latches 15 (e.g., 200 latches) each provide an output (e.g., 200 1-bit outputs) to an output compression unit 16 known in the art. The output compression unit outputs a fail signature signal. The fail signature signal indicates either a good circuit or a faulty circuit.

Thus, the circuit is provided with a deterministic stimulus, thereby generating a response from the memory, which is compared to a known expected output. Based on the comparison, the circuit is determined to be good or faulty.

However, in the above-described system as shown in FIG. 1, when the memory outputs greatly increase in number, the latches required for testing consume a large amount of area. This is a problem.

Another problem is that performing compression at system speed of very wide outputs becomes very difficult, if not impossible.

Thus, with the conventional systems, compressing outputs during ABIST testing of a RAM with a very wide output bus in a very fast cycle time can be virtually impossible in addition to the large amount of area that is consumed by the output test latches. Additionally, a large area is required, and more power is consumed, especially related to the dynamic logic used for comparing all outputs.

SUMMARY OF THE INVENTION

It is therefore an object of the present invention to provide an improved memory system for reducing the number of outputs of a wide output bus memory using ABIST.

Another object of the present invention is to provide an improved memory system having a reduced number of output latches and which efficiently compresses outputs during ABIST testing of a memory with a very wide output bus in a very fast cycle time.

In a first aspect of the present invention, a memory test apparatus is provided for use with a memory having a plurality of outputs, which includes: a built-in, self-testing (BIST) test state machine having a plurality of address outputs; a plurality of multiplexers controlled by the BIST test state machine with the counter outputs; and a testing device for testing the memory with a plurality of outputs, wherein the outputs are sent to the plurality of multiplexers controlled by the BIST test state machine with the counter outputs to reduce the memory outputs.

With the invention, the number of output latches can be reduced by adding a test multiplexer (MUX) that further "muxes" down the output data by a factor of 2, 4, etc., depending upon the number of bits of the address counter signal supplied thereto by the test state machine, before latching the data. The reduction of the number of outputs being compressed in one cycle in turn increases the performance. This allows the ABIST to test the memory with reduced test circuitry area, at system speeds, and with no test coverage loss to the memory.

Thus, the present invention accomplishes data compression of a wide output bus at high performance speeds, and reduces the output test latch area, as well as the test clock loading. Further, the present invention extends the address space through test muxing of large output memories to save area and increase performance of compression. This technique saves an immense amount of valuable chip real-estate.

Additionally, the inventive technique increases the performance of the compression in test mode to allow high speed testing with ABIST, and attendant to the reduction in clock generators and latches is the reduction of power.

Further, while the inventive technique requires an increased address space, this usually does not require increased test time when used in a memory macro on a central processing unit (CPU) chip.

Hence, the invention results in a reduced area, increased performance/cycle, and reduced power.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 2:
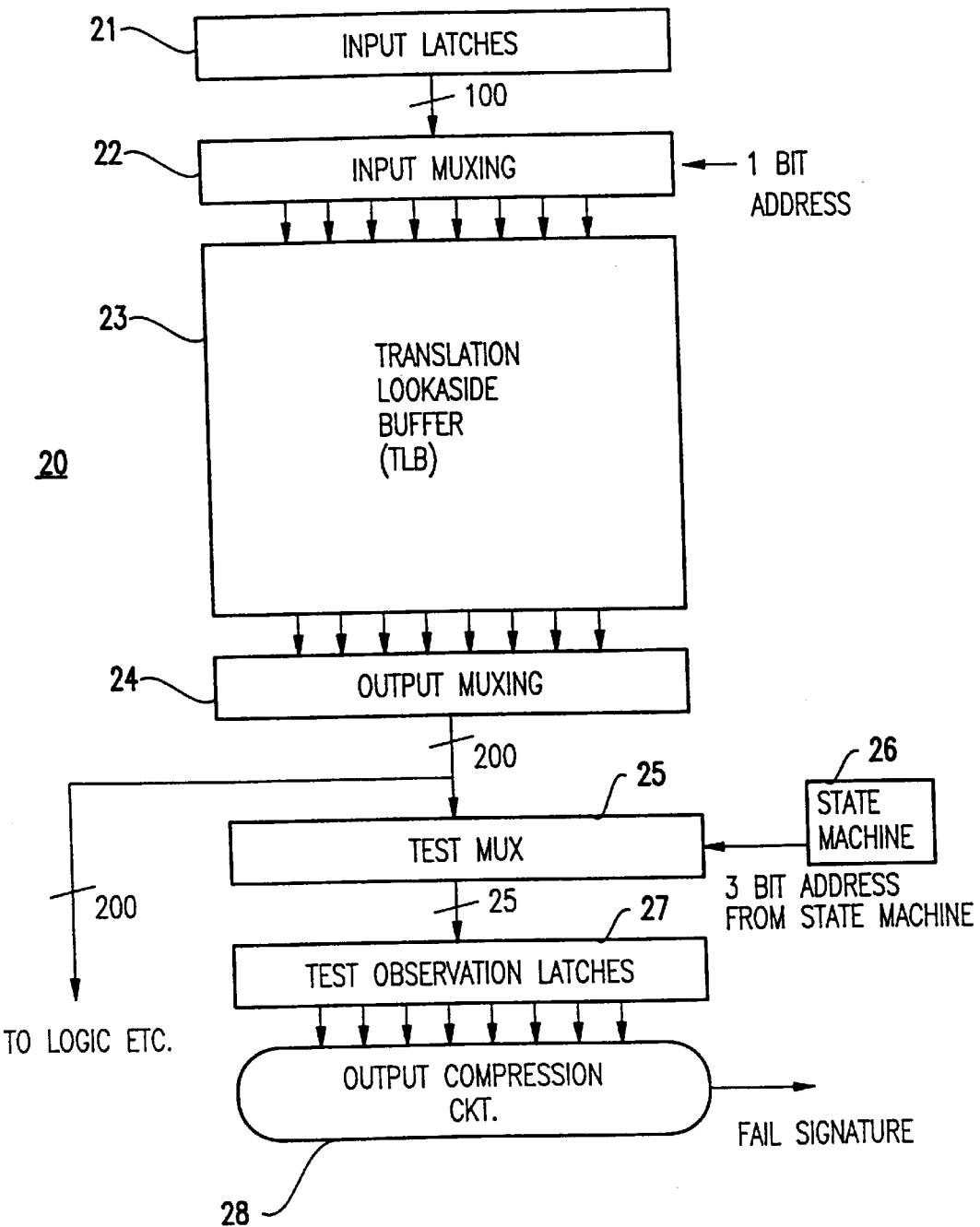
FIG. 2 illustrates an apparatus according to the present invention for compressing wide memory outputs during ABIST testing.

Referring now to the drawings, and more particularly to FIG. 2, there is shown an apparatus 20 according to the present invention for compressing data of a "wide" output bus at high performance speeds.

It is noted that the term "high" is relative since the speed of compression depends on the type of logic used and the technology. For example, it is noted that 25 outputs were able to be compressed in 1.2~1.5 ns, with a first configuration of logic and technology, whereas the same 25 outputs could be compressed using lower power static logic in 2~2.5 ns. It is further noted that, with the invention which uses fewer outputs (25) as described below, lower power static logic can be used to perform the compression algorithm.

Further, the term "wide" is relative to the designer's applications and requirements. Thus, "wide" may signify an output bus width greater than 8 bits, or in some cases less than 8 bits (e.g., 4 bits) depending upon the system and I/O busses being employed and their relative throughput.

The apparatus 20 is for use with a memory such as a random access memory (RAM) having a plurality of outputs, and includes a built-in (on-chip) self-testing (BIST) test state machine 26 having a plurality of counter outputs (e.g., a 3-bit address signal provided by an address counter (not illustrated) in the state machine 26).

Prior to examining the inventive structure in detail, the present inventor discovered that the performance of the compression block could be increased by reducing the number of outputs the output compression circuit had to operate on at a time. Specifically, the inventor found that by increasing the address space in the test mode when the data is read out of the memory (e.g., TLB), the above-described benefits and advantages of the invention could be achieved.

The technique of the invention increases the compression performance and reduces the output latch area required for the RAM (e.g., the TLB 23). It is noted that, while the TLB 23 is the exemplary memory tested in the present invention, other memories also can be tested similarly as would be known by one of ordinary skill in the art taking the present specification as a whole.

Turning now to FIG. 2, a plurality (e.g., 100) of input latches 21 are arranged for providing a plurality of outputs (e.g., 1-bit outputs) to an input multiplexer (MUX) 22. The outputs represent data stored in the memory. The patterns that are used to write and read the memory verify that the memory cell is functioning properly, in addition to testing the address decoding mechanism (i.e., a unique address pattern). The input latches and the input multiplexer 22 each can be formed by, for example, by D-type flip-flops.

Logically, the muxes and latches are the same as those in a conventional system. From a circuit standpoint, they may vary. Any number of input latches may be provided depending upon the size of the input testing stream. The input latches used in the present embodiment are separated from the memory and utilize a master/slave latching scheme.

For example, the master latch may be incorporated as the memory input latch for testing and functional operation, and the slave latch may be used as the testing and functional memory output latch. The input test latches are not used in normal functional mode in the present embodiment. It is noted that the input latches in the present embodiment may be used in both the normal mode or the test mode, by using the MUX 22. In an alternative embodiment, two sets of latches could be provided and connected directly to a memory (a TLB 23 as discussed in further detail below), with one latch set being dedicated to the normal mode and a second set of latches being dedicated for the testing mode. In such a case, the input MUX 22 would still be required at the input.

The input of the TLB 23 receives an address to be able to decode where to store the data (e.g., in one of two locations). MUX 22 does not store the data, but instead it selects between the data.

The MUX 22 provides a plurality of inputs to a translation look-aside buffer (TLB) 23, which in turn acts on the inputs of the MUX 22 and provides a plurality of outputs to a plurality of output multiplexers (MUXes) 24. In the present example, there are an equal number of input latches as inputs (e.g., 100 of each). In an alternative embodiment, data may desirably supplied to multiple inputs simultaneously with a single latch (e.g., for reduction of the input latch area). However, this configuration may be problematic with regard to test coverage of logic sending the data to the memory.

MUXes 24 in turn provide an output to logic circuitry and other system components (not illustrated in FIG. 2), and also provide the output to a test multiplexer (MUX) 25 which is formed in a conventional manner. It is noted that, in an alternative configuration from that shown in FIG. 2, the output muxes could be omitted depending upon the memory (e.g., its width, architecture etc.). Specifically, while the output mux is shown in FIG. 2, it may not be necessary in the case at hand since the memory issues 200 1-bit outputs. In such a case, the memory supplies data to downstream logic or directly to the test mux 25.

The test MUX 25 is controlled by a BIST test state machine 26 with the outputs (unreferenced) of an address counter of the state machine. The BIST test state machine 26 may include pipelined logic, or alternatively may be constructed utilizing a ROM, a programmable logic array (PLA), etc.

Looking more closely at the control operation by the state machine, the MUX 25 is controlled by the state machine by a 3-bit address signal. The state machine sequences through addresses to cycle through all of the memory's address locations with all of the preferred patterns. With the added three address bits, eight times more memory cycle will be required to fully exercise the memory through this compression methodology.

The state machine will cycle through the 8 output latch addresses, while keeping the memory addresses constant, and the state machine will hold the output mux at a single address while cycling through the entire memory address.

It is noted that the address counter outputs need not be sequential, but may be arbitrary 3-bit values (e.g., 1, 1, 1; 1, 1, 0; etc.)

The test MUX 25 increases the compression performance and reduces the output latch area for the memory. Test MUX 25 provides an output to a plurality of observation latches 27 (e.g., 25 observation latches) which in turn provide outputs to an output compression unit 28. The number of bits of the address signal will determine the number of test observation latches required. For example, a 3-bit address signal will result in 25 test observation latches (e.g., 200 bit output/$2^3$= 25 test observation latches).

Figure 1:
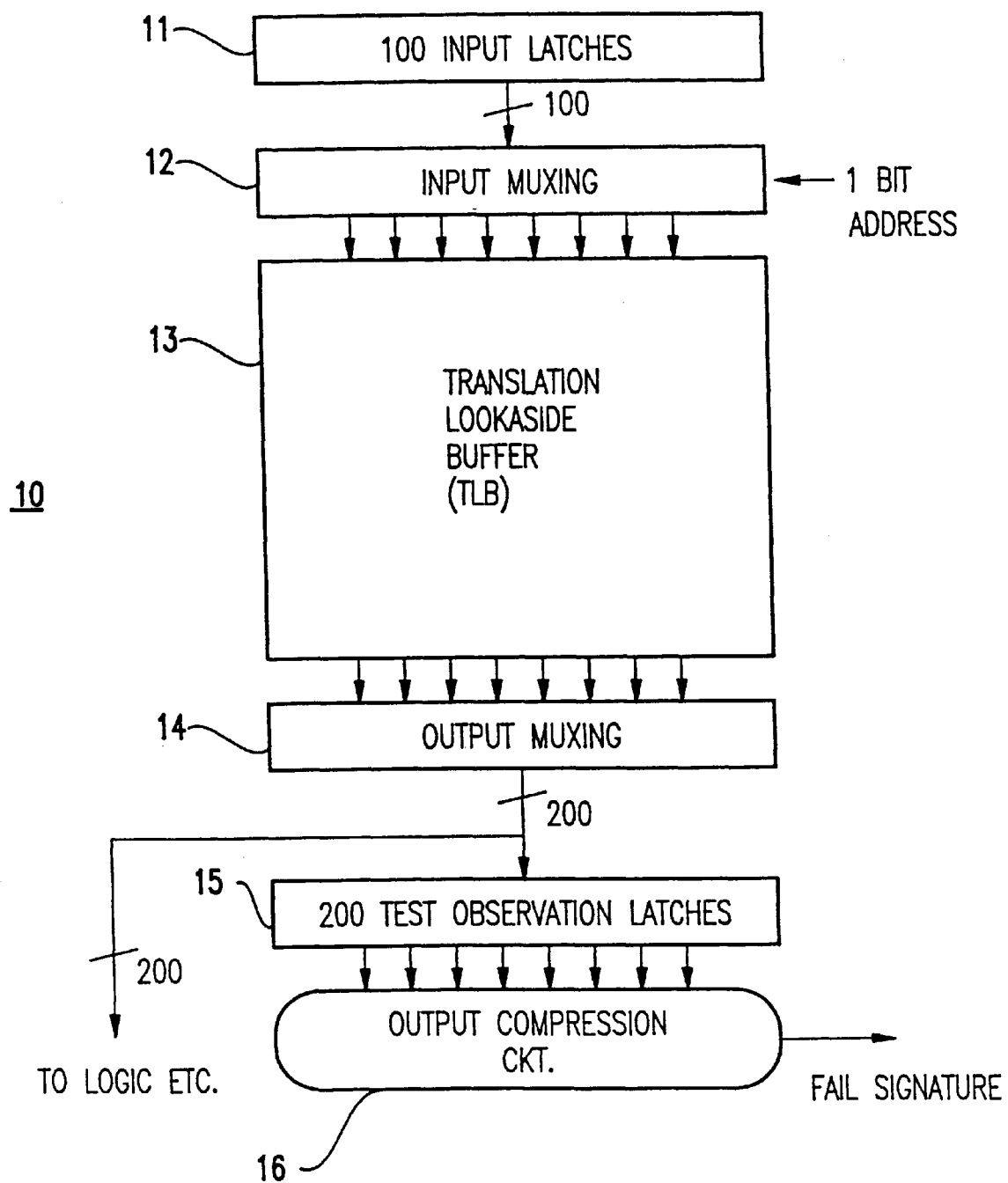
FIG. 1 illustrates a conventional structure for compression of outputs for memories tested by an ABIST device.

The observation latches 27 and the output compression unit 28 may have the same structure as those shown in FIG. 1. For example, in one configuration, the output compression circuit may be a XOR logic circuit. The data output is compared with the data expected and if a match occurs, a "0" is generated. If the data output does not match with the expected data, then a "1" is generated. One approach is to employ deterministic patterns to test memories, such as checkerboard, word-line stripe, unique address, bit-line strip, etc. With the patterns, the outputs can be predicted. However, pseudo-random data also can be provided with a linear feedback shift register (LFSR) and a compaction algorithm can be performed with the output data using a multiple input signature register (MISR).

The outputs of the test observation latches are tested 25 at a time until all 200 outputs from the TLB 23 have been tested. Thus, while total compression cycle time is increased, compression time of each set of 25 outputs is reduced compared to the simultaneous compression of one set of the 200 1-bit outputs.

The output compression unit 28 outputs the Fail signature for signature analysis and for determination of whether the circuit is faulty or error-free.

In operation, advantageously the testing begins with an initialization pattern which is synchronously converted to a succession of sequel patterns, each of them leading to a result pattern, and each result pattern contributing to the signature.

Hereinbelow is a brief description of the testing operation using the apparatus of the present invention. For a unique address pattern, first the memory is written with blanket "0"s (e.g., "0"s throughout), and the operation commences at the first or last address.

At the first (or last) address, a "0" is read, and a "1" is written. Then, the operation changes to the next address, and the same operation is performed. Thus, the "0"s are replaced with "1"s one-by-one (e.g., sequentially). This is performed by incrementing and decrementing the address to ensure that the address decode mechanism/technique is selecting unique memory locations for each address.

It is noted that while some exemplary test patterns have been mentioned above, other test patterns also could be advantageously used according to the designer's requirements, applications and constraints.

Figure 3:
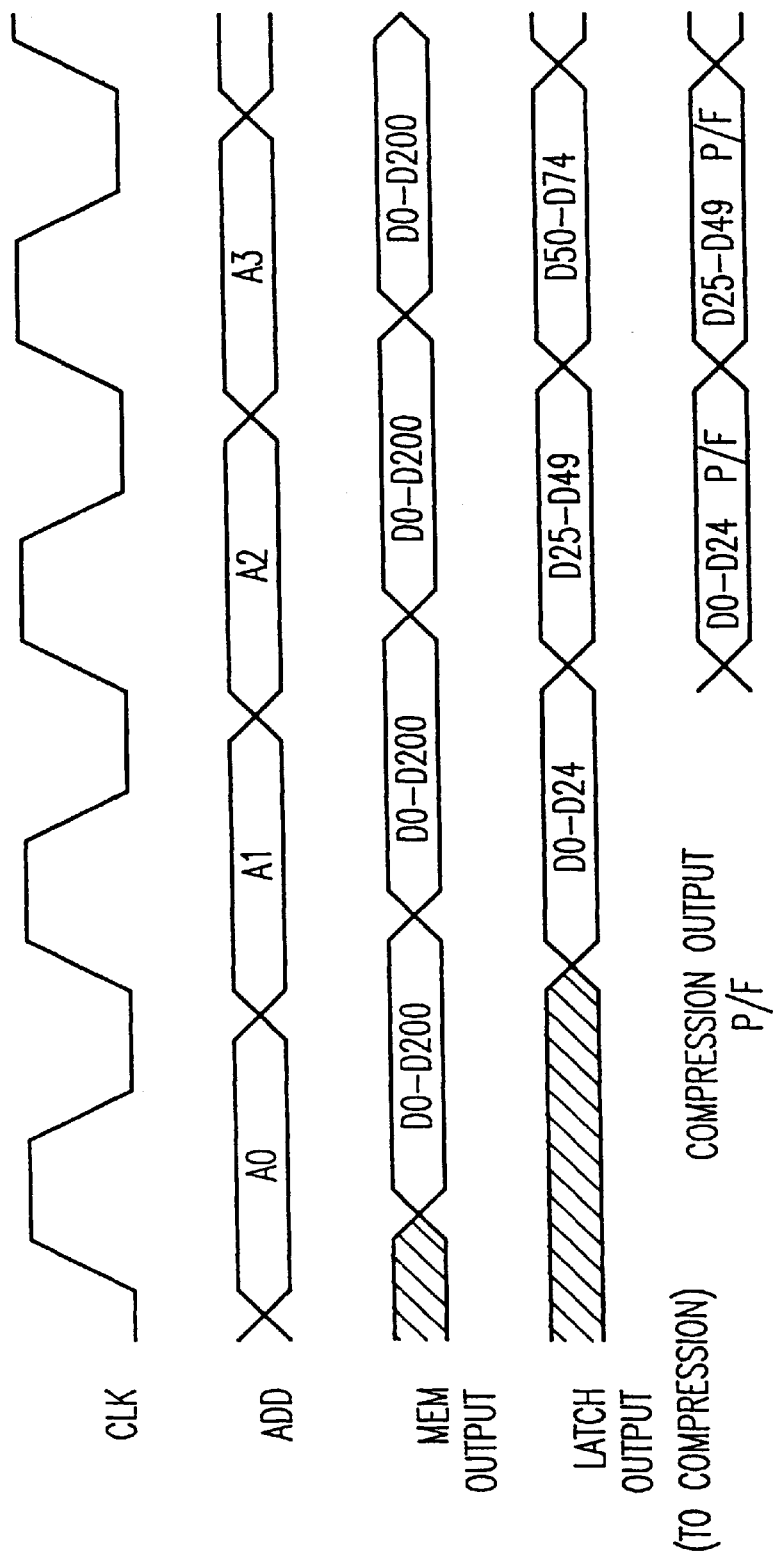
FIG. 3 illustrates a timing diagram of each of key structural components of the apparatus of FIG. 2 according to the present invention.

Turning to FIG. 3, which illustrates a timing diagram of the inventive structure shown in FIG. 2, the operation of the present invention will be examined in detail.

The timing diagram of FIG. 3 illustrates the pipeline architecture of FIG. 2. In FIG. 3, the "CLK" waveform is the system clock, which is assumed to have a 50% duty cycle. The "ADD" signal represents the address being output to the test output mux 25. A0 represents the address in cycle 0, whereas A1 represents the address in cycle 1. "All other memory addresses" include all row and column addresses, if any. These are held constant while addresses on the test mux 25 toggle. It is noted that the memory address will also toggle while test mux addresses are held constant (e.g., required for more complete testing).

"Memory output data" relates to the 200 data outputs from the memory 23. They are all read out at the same time, as shown.

The "Latch Output" includes the 25 memory data outputs being latched and output from the latch 27 in the next cycle. As the address on the test MUX 25 toggles, the remainder of the output data are muxed into the output latches 27 (e.g., 25 bits at a time).

The "Compression Output" waveform indicates the pass/fail compression information output by the output compression circuit 28.

With the structure of FIG. 2, the performance of the compression block is increased by reducing the number of outputs the compression circuit has to operate on at a time (e.g., in the exemplary embodiment only 25 outputs are operated upon as opposed to 200 in the conventional system).

Specifically, by increasing the address space in the test mode when the data is read out of the memory, the invention increases the compression performance and reduces the output latch area (e.g., the number of test observation latches 15 in the conventional system) required for the TLB 23 on the processor chip.

Referring again to FIG. 2, it is noted that with input of the additional 3-bit address signal, the number of output latches decreases by a factor of eight. This reduces the latch output count from 200 to 25, which is an enormous savings in area, and which amounts to about 0.385 mm$^2$ or a 12% savings in area (e.g., in a 0.5 $\mu$m structure). As mentioned above, increasing the bits of the address counter signal would decrease the number of output latches required. It is noted that while the invention has been described above using a 0.5 $\mu$m structure, this scale/technology is merely exemplary and a different savings in area will be realized with a different scale/technology.

It is noted that, in the preferred implementation (e.g., on the chip mentioned above), the technique of using the added address cycles to test the TLB adds nothing in the way of overhead (and further the state of the additional addresses used in testing the TLB does not add any additional cycle time to the testing), because the counter (e.g., address counter) in the ABIST state machine 26 is designed to produce a 5-bit address for the addressing of the Data Storage Array (DSA) that is to be tested by the same state machine.

Functionally, the TLB requires only a 1-bit address to write to the memory 23. The technique for testing according to the present invention utilizes three more address bits (e.g., a total of four address bits, but only 3 bits are used to read, thereby requiring 8 cycles to read out one word line as opposed to one cycle in functional mode). It is noted that while the three additional address bits were chosen for the present implementation, any of one to four additional address bits could have been used in the present testing operation without increasing tester time.

This approach could be used when a single ABIST state machine is only testing one memory with wide outputs (as mentioned above "wide" is relative to the other buses in the memory system and may be as low as 4-bits). The test time would increase in this case, but increasing test time does not impact greatly the overall cost.

For example, if the test time was increased by using the test muxing of the outputs in the TLB in FIG. 2 with 64 word lines, the increased number of cycles would be 512 cycles or 1.54 micro-seconds at a 3.0 ns cycle time. The reduced area for the TLB test latches would far outweigh the increased test time.

In addition to saving chip real-estate by reducing the output latch count and increasing compression performance, this technique also saves area from the reduced size of the output compression circuits and the large reduction in clock load. Indeed, the clock load to drive 200 (as opposed to 25) latches is immense. To drive the 175 additional latches that would be required, an additional 1.5 clock generators would be required. The clock generators for the latches on an exemplary chip's cache are 6800 $\mu$m$^2$ in size. The reduction of 1.5 clock generators would result in an area savings of about 0.01 mm$^2$, which is a large reduction.

Thus, with the present invention, the address space is extended through test muxing of large output memories to save area and increase performance of compression. The present invention saves an immense amount of valuable real-estate. In the example of the TLB on the exemplary chip described, there was approximately 0.4 mm$^2$ or 12.5% savings in overall area of the TLB with test circuitry.

The present invention also increases the performance of the compression in test mode to allow high speed testing with ABIST. With the reduction in clock generators and latches also comes the reduction of power.

Further, while the present invention requires an increased address space, test time is usually not increased when used in a memory macro on a CPU chip. The above advantages are all achieved without any loss of test coverage in the memory.

Thus, the present invention provides a method of reducing the number of memory outputs that a data compression circuit has to compress at one time (e.g., from 200 to 25) by introducing a test multiplexer 25 controlled by an on-chip state machine 26. The state machine 26 has extended addressing where the number of address bits required to control the RAM is increased by the number of bits needed to control the added test MUX 25 on the memory output. This effectively increases testing time by increasing the number of cycles required to test the memory by the factor of the test MUX addressing. However, this allows for reduced test circuitry and a faster frequency with which the data compression of the output can be performed.

With the high performance speeds of today's memory testing, the increased test time is minimal compared to being able to test the memory and compress the results at the high frequencies expected today. Moreover, testing of multiple groups of logic can be performed simultaneously by writing the memory location that feed them in parallel during testing.

In the current embodiment, it is noted that portions of the inventive structure (e.g., test MUX, etc.) is used only during testing. However, such a structure could be modified to be used during normal memory read/write operations as well.

While the invention has been described in terms of a single preferred embodiment, those skilled in the art will recognize that the invention can be practiced with modification within the spirit and scope of the appended claims.

For example, in lieu of a TLB or other cache memory element, other types of memories may be tested. Thus, the concept of reducing a number of outputs may be applied advantageously to other types of memories with larger than desired outputs or even logic macros with a large number of outputs. For a large logic macro with a large number of outputs, a linear feedback shift register (LFSR) can be used to sequence through patterns with a portion of the outputs being observed through a multiple input shift register (MISR). Then, the same patterns may be applied once again while another segment of the outputs are observed, etc.

Further, while the embodiment above has been described with regard to testing a memory element, self-testing of other circuitry (e.g., logic circuitry), could likewise be performed.

Additionally, while the test circuit has been described as being on-chip, an off-chip test circuit alternatively could be employed.

Further, the number of input latches could be reduced by adding a test MUX at the input end, between the input latches and the input MUX.

Having thus described my invention, what I claim as new and desire to secure by Letters Patent is as follows:

1. An apparatus for testing a memory having a plurality of outputs, comprising:
   a built-in self-testing (BIST) test state machine for generating a plurality of address outputs;
   a plurality of multiplexers controlled by the address outputs of the test state machine; and
   means for testing the plurality of outputs of said memory based on said address outputs of said test state machine,
   wherein the plurality of outputs of the memory are input to the plurality of multiplexers and a number of outputs tested simultaneously is less than a total number of outputs of said memory.

2. An apparatus according to claim 1, further comprising:
   a plurality of input latches for providing a plurality of outputs to said memory.

3. An apparatus according to claim 2, further comprising:
   an input multiplexer for receiving and multiplexing said plurality of outputs from said input latches with a second address output.

4. An apparatus according to claim 3, wherein said second address output comprises a 1-bit address signal, and wherein in a first mode said second address output being output by said test state machine.

5. An apparatus according to claim 1, wherein said memory comprises a translation look-aside buffer (TLB).

6. An apparatus according to claim 1, wherein said memory comprises a random access memory (RAM).

7. An apparatus according to claim 1, wherein said plurality of multiplexers include input multiplexers for providing an input to the memory.

8. An apparatus according to claim 1, wherein said plurality of multiplexers include an output multiplexer for receiving the outputs from said memory.

9. An apparatus according to claim 8, wherein said plurality of multiplexers include a test multiplexer for receiving an address output from said state machine and outputs from said output multiplexer representing outputs from said memory,
   said test multiplexer for reducing the number of outputs of said memory tested at a time.

10. An apparatus according to claim 9, wherein said address outputs each comprise a 3-bit address signal for controlling said test multiplexer receiving said outputs from said memory.

11. An apparatus according to claim 9, further comprising a plurality of test observation latches for receiving an output from said test multiplexer.

12. An apparatus according to claim 11, further comprising an output compression circuit for receiving outputs from said plurality of test observation latches, and providing a signal for analysis based on said outputs from said plurality of test observation latches.

13. An apparatus according to claim 12, wherein said signal from said output compression circuit comprises a fail signature signal.

14. An apparatus for testing circuitry having a plurality of outputs, comprising:
   a test state machine built-in to said circuitry, for issuing a plurality of outputs;
   a plurality of multiplexers controlled by outputs from the test state machine; and
   means for testing the circuitry having said plurality of outputs, wherein the outputs are input to the plurality of multiplexers controlled by the test state machine with the outputs, such that a number of outputs of said circuitry tested at a time is less than a total number of outputs of said circuitry.

15. An apparatus according to claim 14, wherein said memory comprises a translation look-aside buffer (TLB).

16. An apparatus according to claim 14, wherein said memory comprises a random access memory (RAM).

17. An apparatus according to claim 14, further comprising:
   a plurality of input latches for providing a plurality of outputs to said memory;
   an input multiplexer for receiving and multiplexing said plurality of outputs from said input latches with a second address output,
   wherein said second address output comprises a 1-bit address signal, and wherein in a first mode said second address output being output by said test state machine,
   wherein said plurality of multiplexers include input multiplexers for providing an input to the circuitry and an output multiplexer for receiving the outputs from said circuit, and a test multiplexer for receiving an address output from said state machine and outputs from said output multiplexer representing outputs from said circuitry,
   said test multiplexer for reducing the number of outputs of said circuitry tested at a time.

18. An apparatus according to claim 17, wherein said address outputs each comprise a 3-bit address signal for controlling said test multiplexer receiving said outputs from said circuitry,
   further comprising a plurality of test observation latches for receiving an output from said test multiplexer and an output compression circuit for receiving outputs from said plurality of test observation latches, and providing a signal for analysis based on said outputs from said plurality of test observation latches,
   wherein said signal from said output compression circuit comprises a fail signature signal.

19. A method of testing a circuit, comprising steps of:
   issuing, from a test state machine, a plurality of outputs;
   controlling a plurality of multiplexers by outputs from the test state machine; and
   testing the circuit with a plurality of outputs, the outputs being input to the plurality of multiplexers controlled by the test state machine with the outputs, such that a number of outputs of said circuit tested at a time is less than a total number of outputs of said circuit.

20. A method according to claim 19, wherein said circuitry comprises one of a translation look-aside buffer (TLB) and a random access memory (RAM).

* * * * *